(12) United States Patent
Ray et al.

(10) Patent No.: US 8,155,283 B2
(45) Date of Patent: Apr. 10, 2012

(54) SYSTEM, METHOD, AND APPARATUS FOR FACILITATING WIDEBAND AUDIO OVER A COIL-ASSISTED DIGITAL SUBSCRIBER LINE LOOP

(75) Inventors: Amar Nath Ray, Shawnee, KS (US); James E. Goggans, Olathe, KS (US)

(73) Assignee: Embarq Holdings Company, LLC, Overland Park, KS (US)

( * ) Notice: Subject to any disclaimer, the term of this patent is extended or adjusted under 35 U.S.C. 154(b) by 788 days.

(21) Appl. No.: 12/331,096

(22) Filed: Dec. 9, 2008

(65) Prior Publication Data

US 2010/0142561 A1 Jun. 10, 2010

(51) Int. Cl.
*H04M 11/00* (2006.01)
*H04J 1/02* (2006.01)

(52) U.S. Cl. ..................... 379/93.08; 370/493
(58) Field of Classification Search ........... 379/93.08, 379/93.01, 90.01, 93.28, 93.31; 370/493
See application file for complete search history.

(56) References Cited

U.S. PATENT DOCUMENTS

| 2002/0106076 A1* | 8/2002 | Norrell et al. ............ 379/399.01 |
| 2003/0108190 A1* | 6/2003 | Kaiser et al. ............ 379/399.01 |

* cited by examiner

*Primary Examiner* — Ping Lee
(74) *Attorney, Agent, or Firm* — Patton Boggs LLP

(57) ABSTRACT

An embodiment of a system, method, and apparatus for facilitating wideband audio communication and digital subscriber line data communication includes a filter configured to be coupled to a line conditioning coil. The line conditioning coil includes a frequency response having a first passband extending over a portion of a narrowband voice frequency range, a second passband extending over a portion of a digital subscriber line frequency range. The line conditioning coil further includes a frequency notch having a frequency range between the first passband and the second passband. The frequency notch attenuates signals over a portion of a wideband audio frequency range. The filter has a cut-off frequency below the frequency notch and a passband extending over at least a portion of the frequency notch. The filter is configured to amplify signals within the frequency range of the frequency notch to compensate for the attenuation caused by the frequency notch.

20 Claims, 5 Drawing Sheets

SYSTEM, METHOD, AND APPARATUS FOR FACILITATING WIDEBAND AUDIO OVER A COIL-ASSISTED DIGITAL SUBSCRIBER LINE LOOP

BACKGROUND OF THE INVENTION

Digital subscriber line (DSL) technologies provide for digital data transmission over the wires of a local telephone network while still allowing simultaneous narrowband telephone voice traffic to be carried over those same wires. These DSL technologies allow a service provider to provide data service to a customer at a customer premise location using established telephone lines. Examples of DSL transmission technologies include asymmetric digital subscriber line (ADSL), and very high speed digital subscriber line (VDSL). DSL typically works by dividing the frequencies used to transmit narrowband voice data and digital data into two separate frequency bands. The narrowband voice traffic is typically carried over a lower frequency band, such as below 4 kHz. The digital data is typically carried in a higher frequency band, such as above 25 kHz. During installation, a DSL filter that functions to filter out the higher frequencies is typically installed on the connection to each phone at the customer premise location so that the phone only sends or receives signals in the lower frequencies. A DSL modem is coupled to the phone line and modulates and demodulates signals at the higher frequencies to provide data communication services to a connected terminal, such as a personal computer. Accordingly, the DSL modem and narrowband telephone equipment can be simultaneously operated on the line without interference from each other.

BRIEF SUMMARY OF THE INVENTION

An embodiment of an apparatus for facilitating wideband audio communication and digital subscriber line data communication over a twisted pair connection includes first and second input terminals configured to be coupled to a line conditioning coil via a first twisted pair connection. The line conditioning coil includes a frequency response having a first passband extending over a portion of a narrowband voice frequency range, a second passband extending over a portion of a digital subscriber line frequency range, and a frequency notch having a frequency range between the first passband and the second passband. The frequency notch attenuates signals over a portion of a wideband audio frequency range. The apparatus further includes first and second output terminals configured to be coupled to a wideband audio telephony device via a second twisted pair connection. The wideband audio telephony device is configured to transmit and receive audio within the wideband audio frequency range. The apparatus further includes a wideband filter coupled between the first and second input terminals and the first and second output terminals. The wideband filter has a cut-off frequency below the frequency notch and a passband extending over at least a portion of the frequency notch. The wideband filter is configured to amplify signals within the frequency range of the frequency notch to compensate for the attenuation caused by the frequency notch.

An embodiment of an apparatus for facilitating wideband audio communication and digital subscriber line data communication includes a filter configured to be coupled to a line conditioning coil. The line conditioning coil includes a frequency response having a first passband extending over a portion of a narrowband voice frequency range, a second passband extending over a portion of a digital subscriber line frequency range. The line conditioning coil further includes a frequency notch having a frequency range between the first passband and the second passband. The frequency notch attenuates signals over a portion of a wideband audio frequency range. The filter has a cut-off frequency below the frequency notch and a passband extending over at least a portion of the frequency notch. The filter is configured to amplify signals within the frequency range of the frequency notch to compensate for the attenuation caused by the frequency notch.

An embodiment of an apparatus for facilitating wideband audio communication and digital subscriber line data communication over a twisted pair connection includes first and second input terminals configured to be coupled to a line conditioning coil via a first twisted pair connection. The line conditioning coil includes a frequency response having a first passband extending over a portion of a narrowband voice frequency range, a second passband extending over a portion of a digital subscriber line frequency range, and a frequency notch having a frequency range between the first passband and the second passband, the frequency notch attenuating signals over a portion of a wideband audio frequency range. The first and second output terminals are configured to be coupled to a wideband audio telephony device via a second twisted pair connection. The wideband audio telephony device is configured to transmit and receive audio within the wideband audio frequency range. The apparatus further includes a filter coupled between the first and second input terminals and the first and second output terminal. The filter has a cut-off frequency below the frequency notch and a passband extending over at least a portion of the frequency notch. The filter is configured to amplify signals within the frequency range of the frequency notch to compensate for the attenuation caused by the frequency notch. The filter includes a first transistor device, a second transistor device, a first capacitance device, and a second capacitance device. The second transistor device is cross-coupled to the first transistor device. The first capacitance device is coupled between a drain terminal of the first transistor device and a ground connection. The second capacitance device is coupled between a source terminal of the second transistor device and the ground connection.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE INVENTION

Figure 1A:
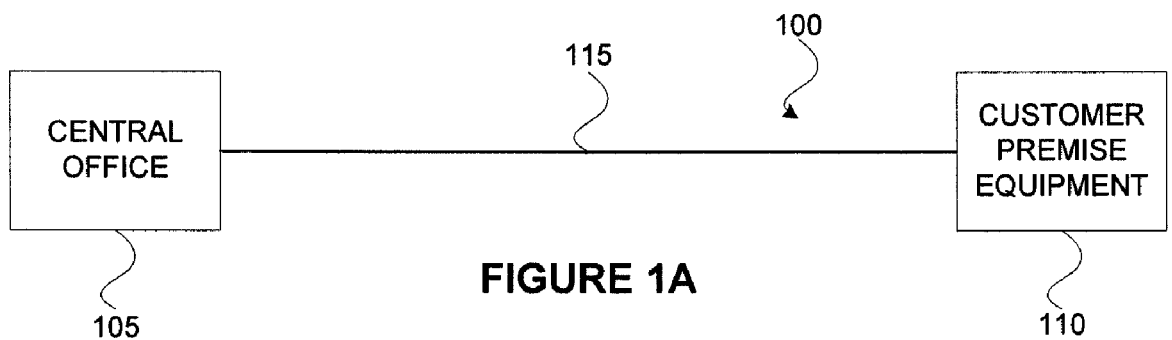
FIG. 1A is an embodiment of a system for connecting a central office to customer premise equipment via a twisted pair connection.

FIG. 1A is an embodiment of a system 100 for connecting a central office 105 to customer premise equipment 110 via a twisted pair connection 115. In at least one embodiment, the twisted pair connection is a copper twisted line pair. In a typical installation of a telephone, the customer premises equipment 110 may be located 27 Kft away from the central office 105. The system 100 of FIG. 1A is subject to telephone loop attenuation such that higher frequency signals are greatly attenuated when transmitted over the twisted pair connection 115. In a particular embodiment, the customer premise equipment 110 includes a narrowband telephone device configured to transmit and receive audio signals in a narrowband frequency range. Traditionally, narrowband telephone calls are limited to frequencies in the range of 300-3400 Hz. A customer may wish to be provided with DSL services over the twisted pair connection 115. In addition, a customer may wish to use a wideband audio telephony device at the customer premise location. Wideband audio telephony devices are configured to transmit and receive audio within a wideband audio frequency range. Wideband audio telephony devices provide much improved voice quality over traditional narrowband audio telephone devices by providing an extended frequency range for voice transmission. However, the system 100 of FIG. 1A is not suitable for use in transmitting DSL data signals or wideband audio. The wideband audio frequency range includes a frequency range that is greater than that of a traditional or narrowband telephone signal. In a particular embodiment, the wideband audio frequency range extends from 30 Hz to 7,000 Hz. In still other embodiments, the wideband audio range may extend up to 8 kHz or higher. DSL data signals are typically transmitted at frequencies of 25 kHz and above.

Figure 2:
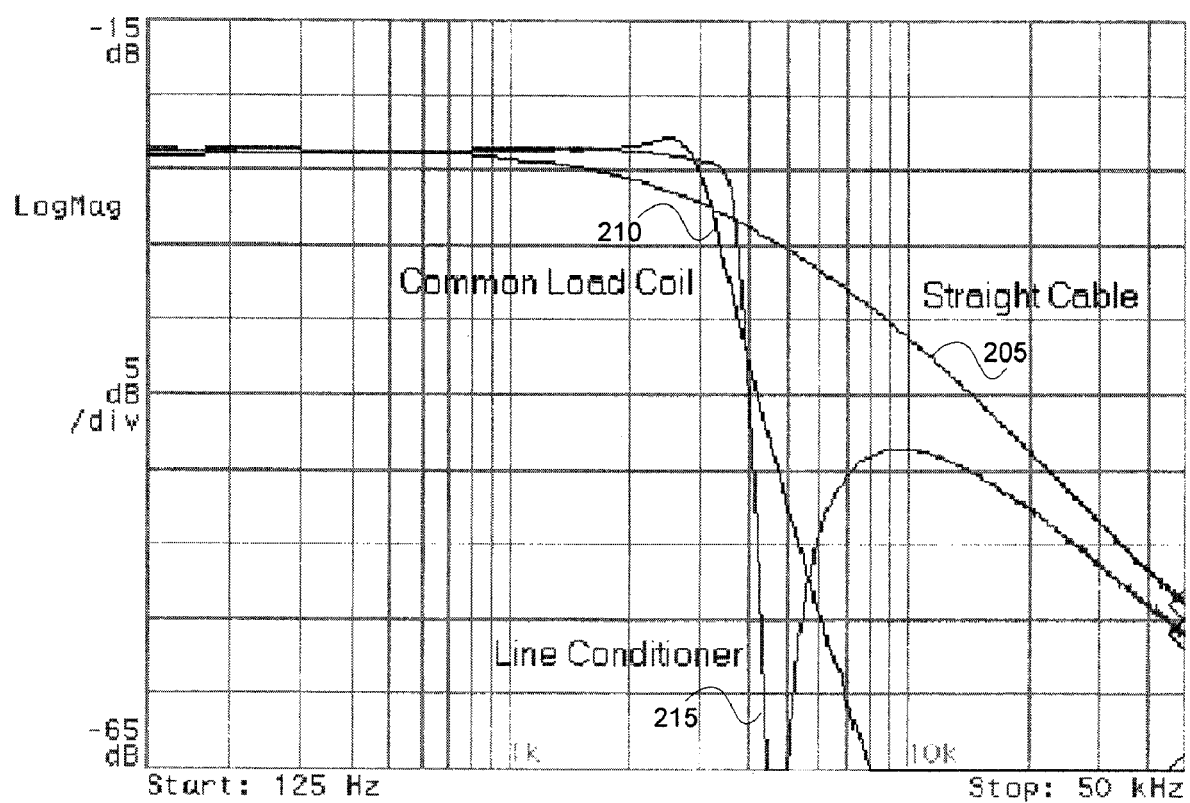
FIG. 2 illustrates representative frequency responses of the systems of FIG. 1A, FIG. 1B, and FIG. 1C.

FIG. 2 illustrates a representative straight cable frequency response 205 of the system 100 of FIG. 1A of a twisted pair connection 115 having a length of 15K feet. As illustrated in FIG. 2, substantial signal attenuation occurs above 1 kHz for the twisted pair connection 115. Accordingly, signals within the narrowband voice region are attenuated greatly for frequencies above 1 kHz. Non-uniform signal strength over the voice band region causes nonlinearity and degraded voice signal quality. In addition, for a typical configuration, twisted pair loop attenuation may vary by more than 50 db across the ADSL signal bandwidth of between 25 kHz and 1104 kHz. As a result, the system 100 of FIG. 1A cannot effectively transmit wideband audio or DSL signals, and transmission of narrowband audio signals is greatly degraded.

Figure 1B:
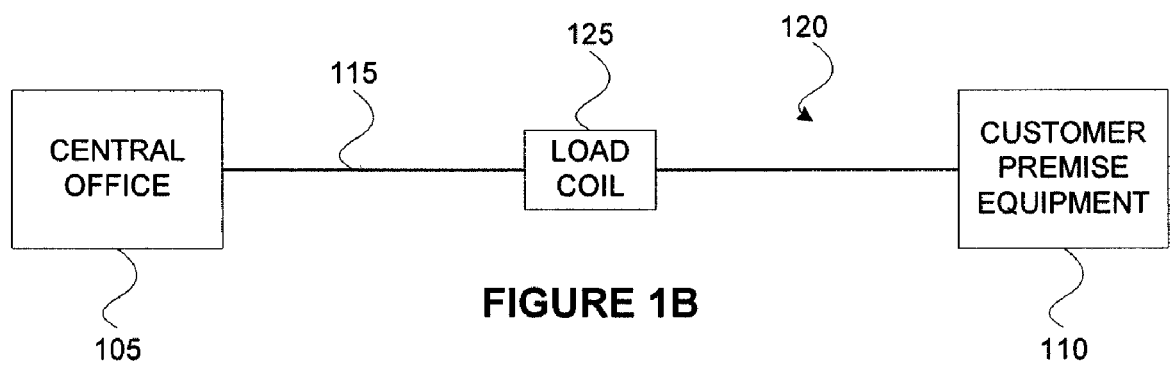
FIG. 1B is an embodiment of a system for connecting a central office to a customer premise equipment via a twisted pair connection using a load coil.

FIG. 1B is an embodiment of a system 120 for connecting a central office 105 to a customer premise equipment 110 via a twisted pair connection 115 using a load coil 125. The load coil 125 is coupled between the central office 105 and the customer premise equipment 110. The load coil 125 is used to counteract the attenuation within the narrowband audio range produced by the twisted pair connection 115. The load coil 125 is an inductive coil that counteracts the capacitive effect of the twisted pair connection 115. In a typical implementation, one or more load coils are coupled between the central office 105 and the customer premise equipment 110. In a typical configuration, a load coil 125 may be placed at distances of every 3K feet to 6K feet between the central office 105 and the customer premise equipment 110. Although the load coil 125 improves signal quality within the narrowband range, for signals with frequencies higher than normal voice band frequency, the signals are greatly attenuated. Accordingly, DSL data signals and wideband audio signals cannot pass through a load coil 125. As a result, load coils 125 must typically removed from the twisted pair connection 115 to provide DSL service to customer premise equipment 110.

Referring again to FIG. 2, a representative common load coil frequency response 210 for the system 120 of FIG. 1B is illustrated. As shown in FIG. 2, the common load coil frequency response 210 greatly attenuates signals above the narrowband voice frequency range for telephony signals. As a result, a load coil 125 cannot be used in a twisted pair connection 115 that will be used to transmit wideband audio or DSL data signals.

Figure 1C:
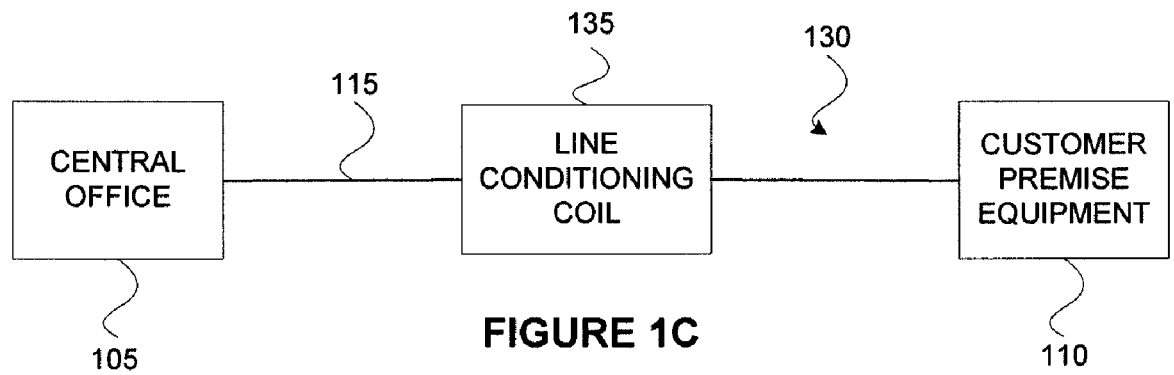
FIG. 1C is an embodiment of a system for connecting a central office to customer premise equipment via a twisted pair connection using a line conditioning coil.

FIG. 1C is an embodiment of a system 130 for connecting a central office 105 to customer premise equipment 110 via a twisted pair connection 115 using a line conditioning coil 135. In a typical installation, one or more line conditioning coils 135 are used to replace one or more preexisting load coils 125 coupled to a twisted pair connection 115. The line conditioning coil 135 is coupled between the central office 105 and the customer premise equipment 110. The line conditioning coil 135 is a type of coil designed to pass narrowband voice signals as well as DSL data signals. The line conditioning coil 135 accomplishes this by providing a relatively flat frequency response for narrowband voice traffic while providing an acceptable level of transmission at the 25 kHz and higher frequency range required for DSL. In at least one embodiment, the line conditioning coil 135 includes an LC notch filter providing internal inductance and capacitance with a resonant point tuned to the frequency space between the plain-old telephone service (POTS) signal frequency range and the ADSL signal frequency range. In some embodiments, the notch filter includes an inductor and a capacitor that passes most frequencies unaltered, but attenuates those in a specific range to very low levels. In various embodiments, the line conditioning coil 135 may be a Smart Coil as manufactured by Charles Industries, Ltd. In still other embodiments, the line conditioning coil 135 may be any type of coil designed to pass narrowband voice signals as well as higher frequency data signals.

FIG. 2 illustrates a representative line conditioning coil frequency response 215 of the system 130 of FIG. 1C. As illustrated in FIG. 2, the line conditioning coil 135 substantially attenuates any signal in the approximate frequency range between 4 kHz and 25 kHz. This frequency range is known as the dead zone for a line conditioning coil 135, and typically extends over the upper frequency range of a wideband audio signal. Therefore, a wideband audio telephony device, such as an analog or digital wideband phone, when connected to a line conditioning coil assisted DSL loop may not function properly because a substantial portion of the audio signal will be blocked or severely attenuated by the line conditioning coil 135.

Figure 3A:
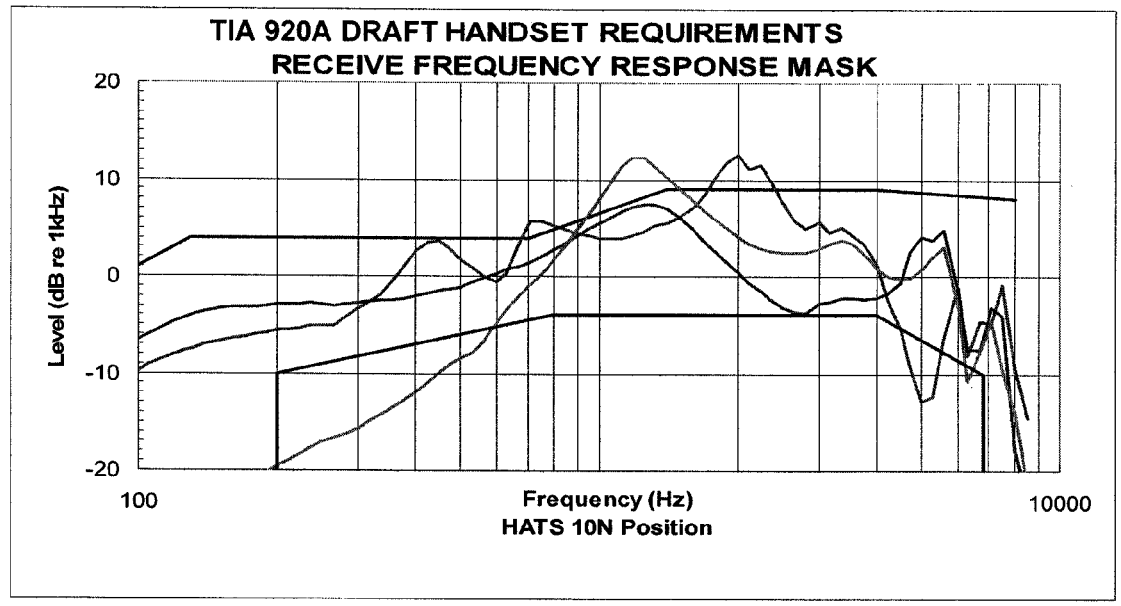
FIG. 3A illustrates receive frequency responses for several representative wideband handsets.
Figure 3B:
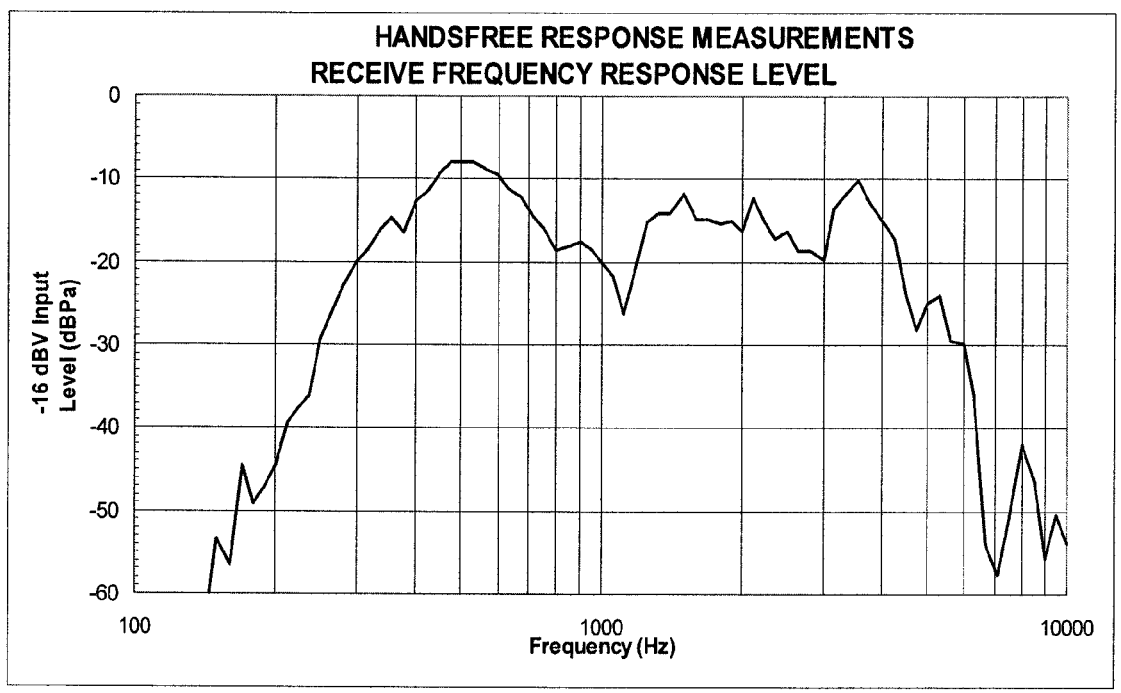
FIG. 3B illustrates a representative hands free frequency receive response for a representative wideband phone operating in a hands free mode.

FIG. 3A illustrates receive frequency responses for several representative wideband handsets, as well as the receive frequency response mask as specified in the TIA/ANSI 920-A Standards Specification Draft which describes transmission requirements for wideband digital telephones. FIG. 3B illustrates a representative hands free frequency receive response for a representative wideband phone operating in a hands free mode. As illustrated in FIGS. 3A and 3B, a substantial amount of sound energy is present in the frequency range between 4 kHz to 8 kHz for a wideband audio signal. The sound energy within this frequency range provides the robust voice quality offered by the use of wideband audio telephony. This superior voice quality cannot be provided to a DSL customer having a wideband telephony device in a system configured as illustrated in FIG. 1C due to the dead zone caused by the use of one or more line conditionings coil 135.

Figure 4:
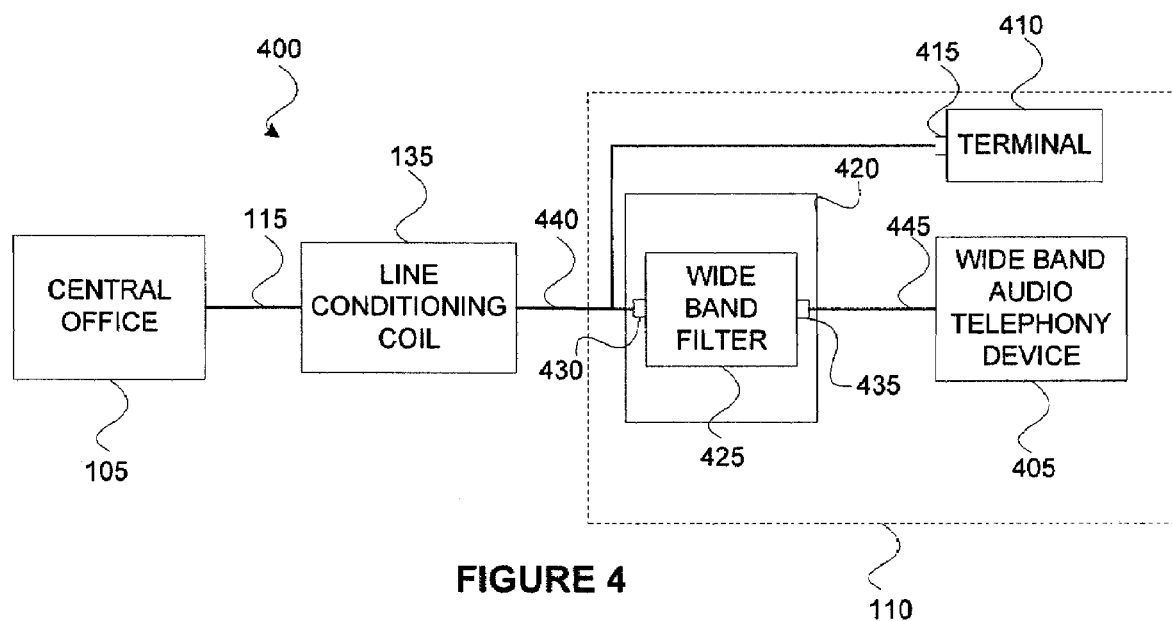
FIG. 4 is an embodiment of a system for facilitating wideband audio communication and digital subscriber line data communication over a twisted pair connection.

FIG. 4 is an embodiment of a system 400 for facilitating wideband audio communication and digital subscriber line data communication over a twisted pair connection 115. The system 400 includes a central office 105 coupled to customer premise equipment 110 via a twisted pair connection 115. The system 400 further includes a line conditioning coil 135 coupled between the central office 105 and the customer premise equipment 110. Although the embodiment illustrated in FIG. 4 includes a line conditioning coil 135, it should be understood that in other embodiments other types of coils may be used. In a particular embodiment, it is desired to communicate both a wideband audio signal and a digital subscriber line (DSL) signal between the central office 105 and the customer premise equipment 110. In the illustrated embodiment, the customer premise equipment 110 includes a wideband audio telephony device 405. In at least one embodiment, the wideband audio telephony device 405 is a digital wideband telephone configured to transmit and receive audio within the wideband audio frequency range. In another embodiment, the wideband audio telephony device 405 is an analog wideband telephone configured to transmit and receive audio within the wideband audio frequency range.

The customer premise equipment 110 may further include terminal 410 configured to transmit and receive DSL data via a DSL interface 415. In at least one embodiment, the terminal 410 is a personal computer. In at least one embodiment, the DSL interface 415 is a DSL modem. In various embodiments, the customer premise equipment 110 further includes a wideband filter device 420. The wideband filter device 420 includes input terminals 430 configured to be coupled to the line conditioning coil 135 via a first twisted pair connection 440. The line conditioning coil 135 includes a frequency response having a first passband extending over a portion of the narrowband voice frequency range, and a second passband extending over a portion of the DSL frequency range. The frequency response of the line conditioning coil 135 further includes a frequency notch, or a dead zone, having a frequency range between the first passband and the second passband. The frequency notch attenuates signals over a portion of the wideband audio frequency range. In a particular embodiment, the narrowband voice frequency range includes a frequency range of between 200 Hz and 3.4 kHz. In at least one embodiment, the DSL frequency range includes a frequency range between 25 kHz and 1104 kHz. In at least one embodiment, the wideband audio frequency range includes a frequency range between 30 Hz and 8 kHz. In a particular embodiment, the frequency notch includes a frequency range between 4 kHz and 25 kHz.

The wideband filter device 420 further includes an output terminal 435 configured to be coupled to the wideband audio telephony device via a second twisted pair connection 445. The wideband filter device 420 further includes a wideband filter 425 coupled between the input terminals 440 and the output terminals 445. In a particular embodiment, the wideband filter 425 is a highpass filter having a cutoff frequency below the lowest frequency of the frequency notch caused by the line conditioning coil 135. In another embodiment, the wideband filter 425 is a bandpass frequency filter having a cutoff frequency below the frequency notch, and has a passband extending over a portion of the frequency notch. In a particular embodiment, the passband of the wideband filter 425 extends over the entire portion of the frequency notch. In at least one embodiment, the wideband filter 425 includes one or more amplifiers configured to amplify signals within the frequency range of the frequency notch in order to compensate for the attenuation caused by the frequency notch due to the line conditioning coil 135. In still other embodiments, the one or more amplifiers may be included within the wideband filter device 420. Wideband audio signals transmitted over the twisted pair connection 115 will be amplified by the wideband filter device 420 to compensate for attenuation caused by the line conditioning coil 135. By use of the wideband filter device 420, a user at the customer premise location is able to use a wideband audio telephony device 405 to its full capabilities on a twisted pair connection 115 that has been configured to support DSL services via implementation of a line conditioning coil, such as line conditioning coil 135.

Figure 5:
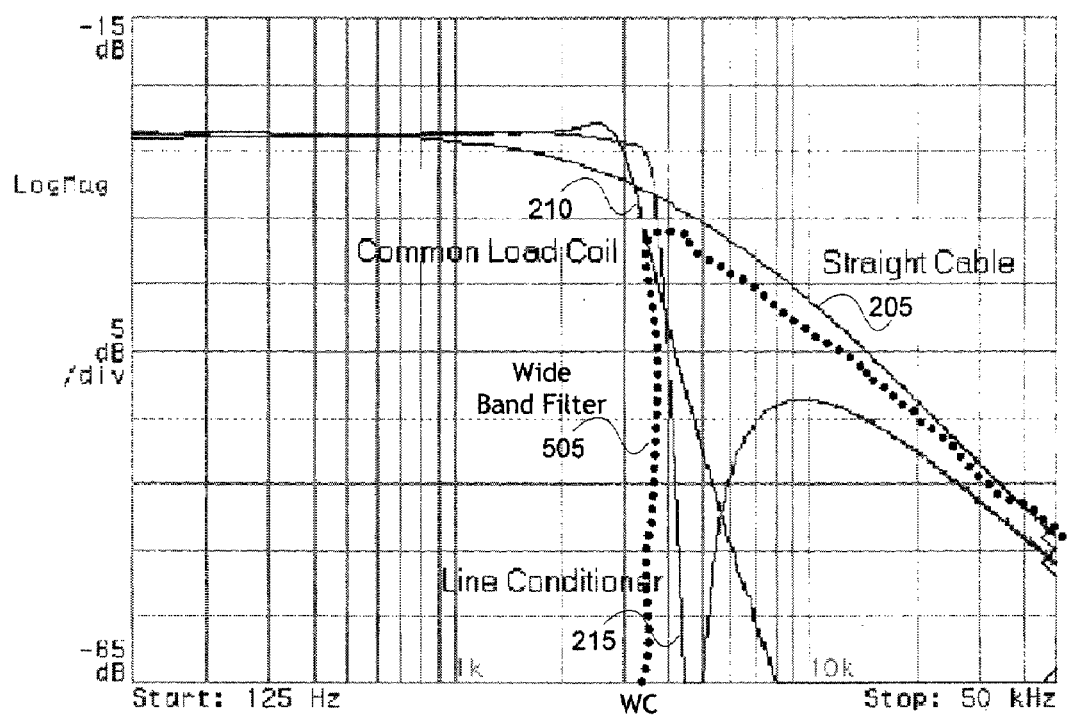
FIG. 5 illustrates a representative wideband filter frequency response of the wideband filter device of FIG. 4 according to an embodiment.

FIG. 5 illustrates a representative wideband filter frequency response 505 of the wideband filter device 420 of FIG. 4 according to an embodiment. As illustrated in FIG. 5, the wideband filter 425 has a cutoff frequency (Wc) below the frequency notch of the line conditioning coil 135, and has a passband that extends over the frequency range of the frequency notch. Accordingly, the wideband filter 425 will amplify signals within the wideband audio frequency range to compensate for attenuation caused by the line conditioning coil 135.

Figure 6:
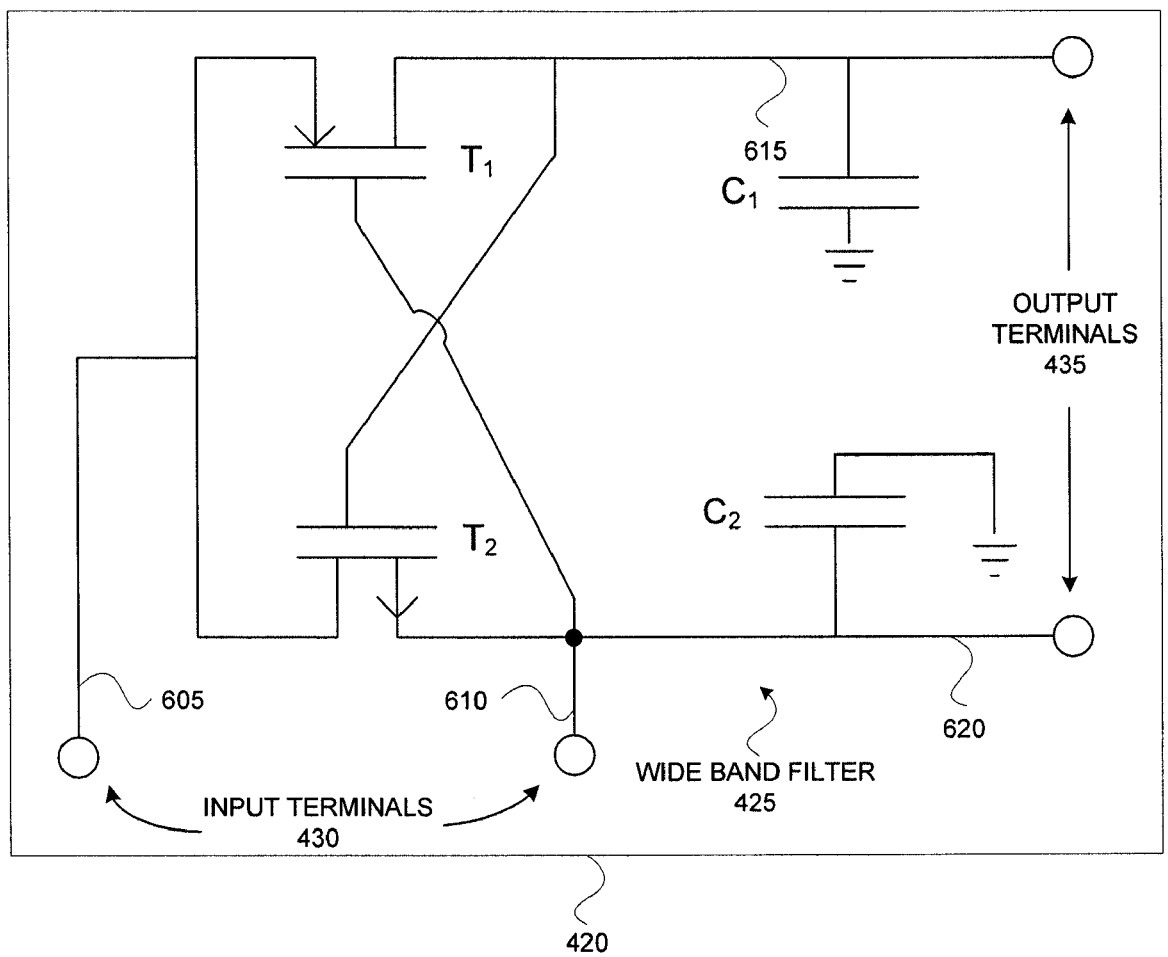
FIG. 6 illustrates a simplified circuit diagram for the wideband filter device according to a particular embodiment.

FIG. 6 illustrates a simplified circuit diagram for the wideband filter device 420 according to a particular embodiment. The wideband filter 425 and the wideband filter device 420 includes a first transistor device $T_1$, a second transistor device $T_2$, a first capacitance device $C_1$, and a second capacitance device $C_2$ connected as shown in FIG. 6. A gate terminal of the first transistor device $T_1$ is connected to a source terminal of the second capacitance device $T_2$. A gate terminal of the second transistor device $T_2$ is connected to a drain terminal of the first transistor device $T_1$. Accordingly, the first transistor device $T_1$ and the second transistor device $T_2$ are cross-coupled to each other. The drain terminal of the first transistor device $T_1$ is further connected to a ground through the first capacitance device $C_1$, while the source terminal of the second transistor device $T_2$ is further connected to the ground through the second capacitance device $C_2$. A first input terminal 605 of the input terminals 430 is connected to a source of the first transistor device $T_1$, and a drain of the second transistor device $T_2$. A second input terminal 610 of the input terminals 430 is connected to the gate of the first transistor device $T_1$ and the source of the second transistor device $T_2$. In still other embodiments, the wideband filter 425 may be one or more RLC circuits.

A first output terminal 615 of output terminals 435 is coupled to the drain of the first transistor device $T_1$, and a second output terminal 620 of the output terminals 435 is coupled to the source of the second transistor device $T_2$. In at least one embodiment, the first input terminal 605 and the second input terminal 610 are configured to be coupled to individual lines of a twisted pair connection 115 in which the twisted pair connection 115 is further coupled to line conditioning coil 135. In at least one embodiment, the first output terminal 615 and the second output terminal 620 are configured to be coupled to individual lines of a twisted pair connection coupled to the wideband audio telephony device 405, such as a wideband audio telephone.

The cutoff frequency $W_c$ of the wideband filter 425 illustrated in FIG. 6 may be given by the following equation:

$$W_c = \sqrt{(Gt_1 * Gt_2 / C_1 * C_2)}$$

In the above equation, $Gt_1$ and $Gt_2$ is equal to, or representative of, the transconductances of the first transistor device $T_1$ and the second transistor device $T_2$, respectively. $C_1$ and $C_2$ ate equal to, or representative of, capacitance values associated with the first capacitance device $C_1$ and a second capacitance device $C_2$, respectively. The cutoff frequency $W_c$ or the bandwidth of the wideband filter 425 may be adjusted by changing the values of $Gt_1$, $Gt_2$, $C_1$, and $C_2$.

Although the particular embodiment of the wideband filter device 425 illustrated in FIG. 6 is described as using discrete components, it should be understood that the wideband filter device 425 may be formed of one or mote hardware elements, software elements, and or discrete circuit elements. In a particular embodiment, the wideband filter device 425 may include a software frequency filter. In still other embodiments, the wideband filter device 425 may be formed of one or more integrated circuits. In addition, although embodiments described herein are discussed with respect to twisted pair connections configured to support the communication of DSL data signals, it should be understood that in other embodiments the wideband filter device 425 may be configured to interoperate with communication lines configured to support any desired communication signals.

The illustrative embodiments can take the form of an entirely hardware embodiment, an entirely software embodiment, or an embodiment containing both hardware and software elements. Furthermore, the illustrative embodiments can take the form of a computer program product accessible from a computer-usable or computer-readable medium providing program code for use by or in connection with a computer or any instruction execution system. For the purposes of this description, a computer-usable or computer-readable medium can be any tangible apparatus that can contain, store, communicate, propagate, or transport the program for use by or in connection with the instruction execution system, apparatus, or device.

The computer-usable or computer-readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD.

Further, a computer storage medium may contain or store a computer-readable program code, such that when the computer-readable program code is executed on a computer, the execution of this computer-readable program code causes the computer to transmit another computer-readable program code over a communication link. This communication link may use a medium that is, for example, without limitation, physical, or wireless.

The previous detailed description is of a small number of embodiments for implementing the invention and is not intended to be limiting in scope. One of skill in this art will immediately envisage the methods and variations used to implement this invention in other areas than those described in detail. The following claims set forth a number of embodiments of the invention disclosed with greater particularity.

What is claimed as new and desired to be protected by Letters Patent of the United States is:

1. An apparatus for facilitating wideband audio communication and digital subscriber line data communication over a twisted pair connection comprising:
   first and second input terminals configured to be coupled to a line conditioning coil via a first twisted pair connection, the line conditioning coil including a frequency response having a first passband extending over a portion of a narrowband voice frequency range, a second passband extending over a portion of a digital subscriber line frequency range, and a frequency notch having a frequency range between the first passband and the second passband, the frequency notch attenuating signals over a portion of a wideband audio frequency range;
   first and second output terminals configured to be coupled to a wideband audio telephony device via a second twisted pair connection, the wideband audio telephony device configured to transmit and receive audio within the wideband audio frequency range; and
   a wideband filter coupled between the first and second input terminals and the first and second output terminals, the wideband filter having a cut-off frequency below the frequency notch and having a passband extending over at least a portion of the frequency notch, the wideband filter configured to amplify signals within the frequency range of the frequency notch to compensate for the attenuation caused by the frequency notch.

2. The apparatus of claim 1, wherein the wideband filter includes:
   a first transistor device;
   a second transistor device, the second transistor device being cross-coupled to the first transistor device;
   a first capacitance device coupled between a drain terminal of the first transistor device and a ground connection; and
   a second capacitance device coupled between a source terminal of the second transistor device and the ground connection.

3. The apparatus of claim 2, further wherein:
   a gate terminal of the first transistor device is coupled to the source terminal of the second transistor device; and
   a gate terminal of the second transistor device is coupled to a drain terminal of the first transistor device.

4. The apparatus of claim 3, wherein:
   the first input terminal is coupled to a source terminal of the first transistor device and a drain terminal of the second transistor device; and
   the second input terminal is coupled to the gate terminal of the first transistor device and the source terminal of the second transistor device.

5. The apparatus of claim 4, wherein:
   the first output terminal is coupled to the drain terminal of the first transistor device; and
   the second output terminal is coupled to the source terminal of the second transistor device.

6. The apparatus of claim 2, wherein the cut-off frequency ($W_c$) of the wideband filter is determined by the following equation:

$$W_c = \sqrt{(Gt_1 * Gt_2 / C_1 * C_2)}$$

where $G_{t1}$ is equal to a transconductance of the first transistor device, $G_{t2}$ is equal to a transconductance of the second transistor device, $C_1$ is equal to a capacitance of the first capacitance device, and $C_2$ is equal to a capacitance of the second capacitance device.

7. The apparatus of claim 1, wherein the narrowband voice frequency range includes a frequency range of between 200 Hz and 3.4 kHz.

8. The apparatus of claim 1, wherein the digital subscriber line frequency range includes a frequency range between 25 kHz and 1104 kHz.

9. The apparatus of claim 1, wherein the wideband audio frequency range includes a frequency range between 30 Hz and 8 kHz.

10. The apparatus of claim 1, wherein the frequency notch includes a frequency range between 4 kHz and 25 kHz.

11. The apparatus of claim 1, wherein the line conditioning coil is a Smart Coil.

12. The apparatus of claim 1, wherein the wideband audio telephony device comprises a digital wideband phone.

13. The apparatus of claim 1, wherein the wideband audio telephony device is an analog digital wideband phone.

14. The apparatus of claim 1, wherein the wideband filter is configured to be located at a customer premise location.

15. An apparatus for facilitating wideband audio communication and digital subscriber line data communication comprising:
    a filter configured to be coupled to a line conditioning coil, the line conditioning coil including a frequency response having a first passband extending over a portion of a narrowband voice frequency range, a second passband extending over a portion of a digital subscriber line frequency range, and a frequency notch having a frequency range between the first passband and the second passband, the frequency notch attenuating signals over a portion of a wideband audio frequency range, the filter having a cut-off frequency below the frequency notch and having a passband extending over at least a portion of the frequency notch, the filter configured to amplify signals within the frequency range of the frequency notch to compensate for the attenuation caused by the frequency notch.

16. The apparatus of claim 15, wherein the filter is further configured to be coupled to a wideband audio telephony device, the wideband audio telephony device configured to transmit and receive audio within the wideband audio frequency range.

17. An apparatus for facilitating wideband audio communication and digital subscriber line data communication over a twisted pair connection comprising:
    first and second input terminals configured to be coupled to a line conditioning coil via a first twisted pair connection, the line conditioning coil including a frequency response having a first passband extending over a portion of a narrowband voice frequency range, a second passband extending over a portion of a digital subscriber line frequency range, and a frequency notch having a frequency range between the first passband and the second passband, the frequency notch attenuating signals over a portion of a wideband audio frequency range;
    first and second output terminals configured to be coupled to a wideband audio telephony device via a second twisted pair connection, the wideband audio telephony device configured to transmit and receive audio within the wideband audio frequency range; and
    a filter coupled between the first and second input terminals and the first and second output terminals, the filter having a cut-off frequency below the frequency notch and having a passband extending over at least a portion of the frequency notch, the filter configured to amplify signals within the frequency range of the frequency notch to compensate for the attenuation caused by the frequency notch, the filter comprising:
    a first transistor device;
    a second transistor device, the second transistor device being cross-coupled to the first transistor device;
    a first capacitance device coupled between a drain terminal of the first transistor device and a ground connection; and
    a second capacitance device coupled between a source terminal of the second transistor device and the ground connection.

18. The apparatus of claim 17, wherein:
    the first input terminal is coupled to a source terminal of the first transistor device and a drain terminal of the second transistor device;
    the second input terminal is coupled to a gate terminal of the first transistor device and the source terminal of the second transistor device;
    the first output terminal is coupled to the drain terminal of the first transistor device; and
    the second output terminal is coupled to the source terminal of the second transistor device.

19. The apparatus of claim 18, further wherein:
    the gate terminal of the first transistor device is coupled to the source terminal of the second transistor device; and
    a gate terminal of the second transistor device is coupled to a drain terminal of the first transistor device.

20. The apparatus of claim 17, wherein the cut-off frequency ($W_c$) of the filter is determined by the following equation:

$$W_c = \sqrt{(Gt_1 * Gt_2 / C_1 * C_2)}$$

where $G_{t1}$ is equal to a transconductance of the first transistor device, $G_{t2}$ is equal to a transconductance of the second transistor device, $C_1$ is equal to a capacitance of the first capacitance device, and $C_2$ is equal to a capacitance of the second capacitance device.

* * * * *